(12) United States Patent
Sridharan et al.

(10) Patent No.: US 6,525,623 B2
(45) Date of Patent: Feb. 25, 2003

(54) MULTI-LAYER MICROWAVE CIRCUITS AND METHODS OF MANUFACTURE

(75) Inventors: Mahadevan Sridharan, Rockaway, NJ (US); Vasanth Munikoti, Edison, NJ (US)

(73) Assignee: Synergy Microwave Corporation, Paterson, NJ (US)

( * ) Notice: Subject to any disclaimer, the term of this patent is extended or adjusted under 35 U.S.C. 154(b) by 0 days.

(21) Appl. No.: 09/878,031

(22) Filed: Jun. 8, 2001

(65) Prior Publication Data

US 2002/0008599 A1 Jan. 24, 2002

Related U.S. Application Data

(60) Provisional application No. 60/210,725, filed on Jun. 9, 2000.

(51) Int. Cl.[7] .................................. H01P 5/12
(52) U.S. Cl. ........................... 333/128; 333/136
(58) Field of Search ................. 333/128, 136, 333/246, 247, 238, 204, 116

(56) References Cited

U.S. PATENT DOCUMENTS

| | | | |
|---|---|---|---|
| 4,821,007 A | 4/1989 | Fields et al. ............... 333/238 |
| 5,150,088 A | 9/1992 | Virga et al. ................ 333/238 |
| 5,311,406 A * | 5/1994 | Snodgrass et al. ......... 361/792 |
| 5,408,053 A | 4/1995 | Young ....................... 174/264 |
| 5,471,181 A | 11/1995 | Park .......................... 333/246 |
| 5,525,954 A | 6/1996 | Komazaki et al. ......... 333/219 |
| 5,532,643 A | 7/1996 | Kuffner et al. ............ 333/246 |
| 5,534,830 A | 7/1996 | Ralph ........................ 333/128 |
| 5,640,132 A | 6/1997 | Ralph ............................ 333/5 |
| 5,640,134 A | 6/1997 | Ralph ........................ 333/202 |
| 5,640,699 A | 6/1997 | Ralph ........................ 455/326 |
| 5,922,453 A * | 7/1999 | Horn, et al. ............... 428/325 |
| 5,929,729 A * | 7/1999 | Swarup ...................... 333/246 |
| 5,930,665 A | 7/1999 | Cho et al. .................. 438/612 |
| 6,023,210 A | 2/2000 | Tulinsteff .................. 333/238 |
| 6,121,854 A * | 9/2000 | Griffith et al. ............. 333/128 |
| 6,356,166 B1 * | 3/2002 | Goldsmith et al. ......... 333/161 |

OTHER PUBLICATIONS

Rogers Corporation, *About Our Products: Products Presentation*, 4 pages.
Rogers Corp., products listing from web page, 4 pages.*
IEEE Standard Dictionary of Electrical and Electronics Terms, Fourth Edition, p. 210 (dated Jul. 8, 1998).
Neil Sclater & John Markus, McGraw–Hill Electronics Dictionary, Sixth Edition, pp. 290, 447 (dated 1997).

* cited by examiner

*Primary Examiner*—Robert Pascal
*Assistant Examiner*—Dean Takaoka
(74) *Attorney, Agent, or Firm*—Lerner, David, Littenberg, Krumholz & Mentlik, LLP (57) ABSTRACT

A multi-layer circuit comprises first and second transmission lines. The first transmission line includes vertically stacked bottom and middle dielectric layers. A conductive pattern is disposed between the bottom and middle dielectric layers. A bottom ground layer is in contact with a bottom surface of the bottom dielectric layer. The second transmission line is vertically stacked above the first transmission line and includes a top dielectric layer and a conductive pattern in contact with a top surface of the top dielectric layer and at least one ground layer separating a bottom surface of the top dielectric layer from the middle dielectric layer. At least one plated through hole electrically connects the first and second transmission lines. All of the dielectric layers comprise a ceramic-filled substrate with woven glass reinforcement.

23 Claims, 9 Drawing Sheets

MULTI-LAYER MICROWAVE CIRCUITS AND METHODS OF MANUFACTURE

CROSS REFERENCE TO RELATED APPLICATIONS

The present application claims the benefit of U.S. provisional patent application No. 60/210,725 filed Jun. 9, 2000, the disclosure of which is hereby incorporated by reference herein.

BACKGROUND OF THE INVENTION

The demands for smaller high frequency communications system components require smaller RF/microwave function blocks without compromising system performance. While meeting the ultimate design parameters of the system is important, the system components must also be capable of being manufactured in a cost effective manner. A variety of planar transmission structures are available for the design of miniature surface mount components. These structures include, but are not limited to, microstrip, stripline, suspended stripline and coplanar waveguides.

Transmission lines are used in radio frequency (RF) and microwave frequency circuits to guide high frequency signals between points along a particular path in an RF or microwave system. Transmission lines exist in several configurations, and for a given application, the use of a particular type of transmission line is partially based on device parameters such as the operating frequency, power level, and performance requirements. For frequencies up to 1000 MHz, parallel conductors and coaxial are typically used. For higher frequencies, stripline and microstrip techniques are typically used and upwards of 18 GHz, conventional circuit elements and transmission lines are usually replaced with cavity and waveguide techniques.

Common forms of transmission line circuitry include microstrip and stripline. A microstrip transmission line typically includes a conductor pattern on top of a dielectric substrate with a ground layer on the bottom of the substrate. One advantage of the microstrip transmission line is that it is easy to manufacture and components such as resistors, capacitors, and transistors can easily be attached to the upper surface of the microstrip to ensure that the transmission line meets operating parameters. However, one disadvantage of the microstrip transmission line is that the electrical field is not confined to the dielectric substrate and hence the modeling is based on approximation.

A typical stripline transmission line has a flat conductor disposed between two dielectric layers of material, which separate the conductor from two ground planes. The field distribution is confined to the dielectric layers between ground planes and the modeling is quite accurate. However, the typical stripline design is limited in that it is difficult to add non-planar 3-D components, such as resistors, capacitors, inductors, diodes, transistors, etc., to the stripline circuit because it is sandwiched between dielectric. It is, consequently, more difficult to adjust the operating parameters than a microstrip.

Because of the different limitations of stripline and microstrip transmission lines, typically an entire microwave system is not formed with only stripline components or only microstrip components. Typically, a microwave system uses a combination of stripline and microstrip elements connected together by coaxial cables or some other transition between them in a horizontal plane. The circuits are often placed adjacent to each other. Alternatively, multi-layer circuits may utilize stripline transmission lines stacked together with the ground planes of each transmission line separating the circuit conductors. Connection between the various stripline transmission lines may be accomplished by using plated through holes or electromagnetic coupling by forming an open slot in a ground plane separating stripline transmission lines. Formation of slots through the various layers, however, is not generally a cost effective way of establishing a connection between transmission lines.

Another way of manufacturing microwave components involves thick film techniques. For example, a thick film balanced line can be manufactured by depositing two independent metal layers with one thin dielectric layer separating them. Thick film manufacturing techniques have several drawbacks. First, thick film manufacturing processes require specialized manufacturing facilities and equipment. In addition, it is generally difficult to precisely control the dimensions and thickness of the dielectric layer and properly align the metal layers using thick film manufacturing techniques. Specifically, since the width of balanced lines is generally in the range of 0.003 to 0.005 inches, it is difficult to accurately maintain the width of a balanced line within 0.0005 inches. Such manufacturing processes also make it somewhat difficult to maintain the uniformity of a line over a given length. Since the electrical performance of a balanced line depends upon the physical dimensions of the line, the dielectric thickness that separates the conductive layers, as well as the alignment between the metal layers on either side of the dielectric layer, any type of variations in the physical dimensions of the line tend to greatly affect the performance of the balanced line.

There is a need to provide compact RF/microwave components and systems that can be manufactured using low cost fabrication processes. The processes used to manufacture such components should have the ability to provide conductors having uniform conductor line width. In addition, it would be advantageous if operating parameters of the finished component could be optimized so that the component performs according to design specifications. Desirably, the finished component should have small length and width dimensions so that the finished component occupies a small area.

SUMMARY OF THE INVENTION

One aspect of the invention relates to a multi-layer microwave circuit including first and second transmission lines arranged in a vertically stacked relationship. The first transmission line has a bottom dielectric layer and a middle dielectric layer. The dielectric layers have top and bottom surfaces. The first transmission line further includes a conductive pattern disposed between the bottom surface of middle dielectric layer and the top surface of the bottom dielectric layer. A bottom ground layer is in contact with bottom surface of the bottom dielectric layer. The second transmission line is arranged in a vertically stacked relationship above said first transmission line. The second transmission line has a top dielectric layer having top and bottom surfaces. A conductive pattern is in contact with the top surface of the top dielectric layer. According to this aspect, at least one ground layer separates the bottom surface of the top dielectric layer and the top surface of the middle dielectric layer of the first transmission line. Thus, either the ground layer and a layer overlaying the bottom surface of the top dielectric layer or a ground layer overlaying the top surface of the middle dielectric layer. Alternatively, a ground plane may overlie both the bottom surface of the top dielectric layer and the top surface of the middle dielectric layer. Electrical connection is established between the first and second transmission lines by at least one plated through hole extending through the second transmission line and contacting the conductive patterns in both the first transmission line and the second transmission line.

According to a preferred aspect of the invention the dielectric layers include a ceramic-filled soft substrate. Preferably, the ceramic-filled soft substrate has a dielectric constant of about 3 to 10 and a thickness of about 0.004 to 0.031 inches. Preferably, the ground layers include copper. The microwave circuits of the present invention can be used to manufacture a variety of microwave devices such as power splitter (also known as a power divider), phase shifter and mixers. Advantageously, the multi-layer circuit with a microstrip transmission line on the top surface of circuit provides a device that can be optimized by the addition and/or adjustment of components including, but not limited to, transistors, capacitors, and resistors. Another advantage is that multi-layer devices according to the present invention occupy less real estate than devices that include horizontally connected transmission lines. For example, a two way power splitter was fabricated according to the present invention having a length dimension of 0.3 inches and a width dimension of about 0.25 inches.

Another aspect of the invention involves a method of making a microwave component. The method includes the steps of providing first, second and third dielectric substrates, each having top and bottom surfaces. The bottom surface of the first dielectric substrate has a conductive material thereon and forms a ground plane. The top and bottom surfaces of the second and third dielectric substrates both have conductive material thereon. The method further involves removing at least a portion of the conductive material from the bottom surface of the second dielectric substrate to form a conductive pattern. Likewise, a portion of the conductive material on the top surface of the third dielectric substrate is removed to form a conductive pattern. The first, second and third dielectric substrates are arranged in a vertically stacked relationship, wherein the third substrate overlies the second substrate so that a ground plane is formed between the third and second dielectric substrates and the second substrate overlies the first substrate. The conductive pattern on the third dielectric substrate is electrically connected with the conductive pattern on the second dielectric substrate by forming a plated through hole extending through the third dielectric substrate and the second dielectric substrate and contacting the conductive patterns on the third dielectric substrate and the second dielectric substrate. Preferably, the step of forming the conductive pattern includes etching the pattern.

The invention provides a relatively simple and flexible way of providing microwave circuits and components including these circuits. Standard manufacturing techniques can be utilized to connect the various layers of the transmission lines. Optimization of the components is facilitated by having a microstrip circuit on the top surface of the multi-layer circuit structure. Additional advantages of the invention will be set forth in the following detailed description. It is to be understood that both the foregoing general description and the following detailed description are exemplary and are intended to provide further explanation of the invention as claimed.

DETAILED DESCRIPTION OF THE PREFERRED EMBODIMENTS

As previously discussed, the shortcomings of stripline transmission lines and microstrip transmission lines generally prevent a microwave component or system from being manufactured completely from either type of transmission line alone. The present invention uses a hybrid approach to distribute a circuit across multiple layers using the advantages of both types of transmission lines. As a result, conventional components, including, but not limited to power dividers, mixers, phase shifters, and modulators can be miniaturized and occupy lesser area that conventional component manufacturing techniques.

Figure 1:
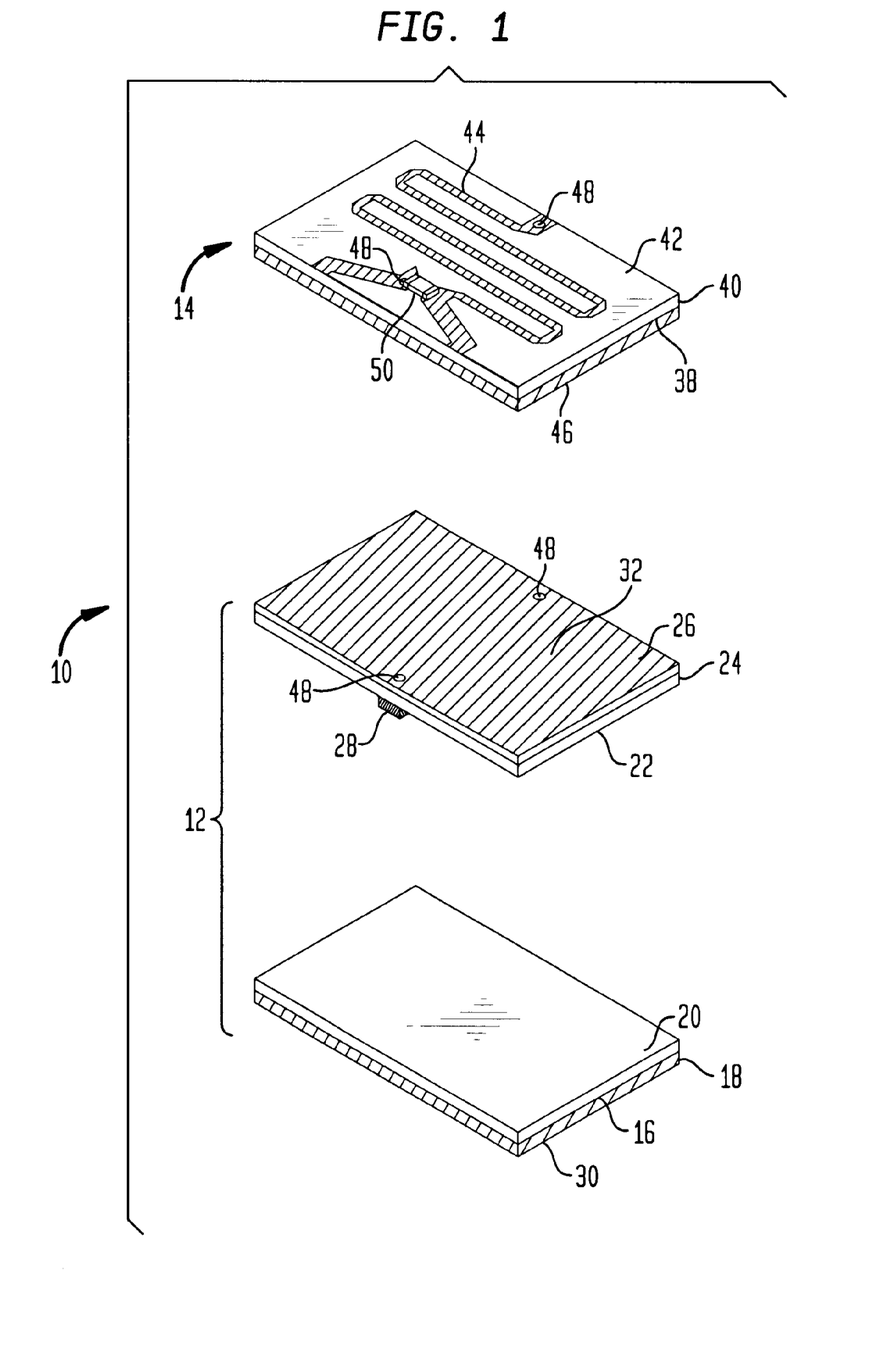
FIG. 1 is an exploded perspective view of a multi-layer microwave circuit.

Referring to FIG. 1, one aspect of the invention relates to a multi-layer microwave circuit 10 including first and second transmission lines 12 and 14. The first transmission line 12 includes a bottom dielectric layer 18 and a middle dielectric layer 24. Preferably, the dielectric layers are generally planar in form. The bottom dielectric layer 18 has a bottom surface 16 and a top surface 20. Likewise, the middle dielectric layer 24 has a bottom surface 22 and a top surface 26.

Figure 2A:
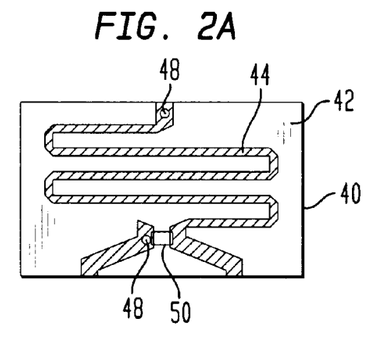
FIG. 2A is a top plan view of the top layer of a multi-layer microwave circuit.
Figure 2B:
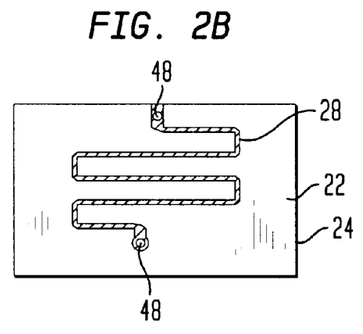
FIG. 2B is a bottom plan view of a conductive pattern on the middle dielectric layer of a multi-layer microwave circuit.
Figure 2C:
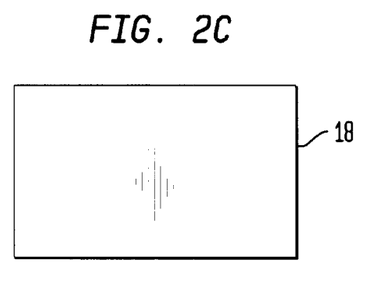
FIG. 2C is a top plan view of a the bottom dielectric layer of a multi-layer microwave circuit.
Figure 3A:
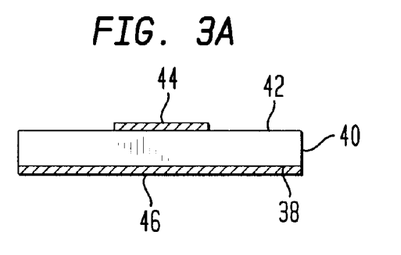
FIG. 3A is an end elevational sectional view of the top dielectric layer including a ground plane in contact with the bottom surface and a conductive pattern in contact with the top surface.
Figure 3B:
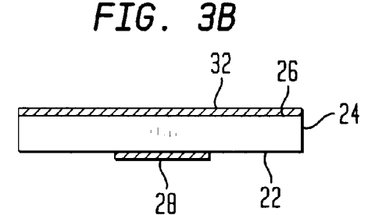
FIG. 3B is an end elevational sectional view of the middle dielectric layer including a ground plane in contact with the top surface and a dielectric pattern in contact with the bottom surface.
Figure 3C:
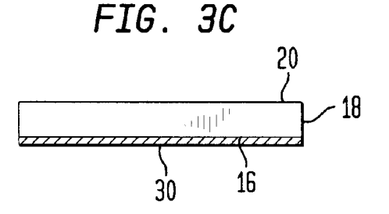
FIG. 3C is an end elevational view of the bottom dielectric layer including a ground plane in contact with the bottom surface.
Figure 4:
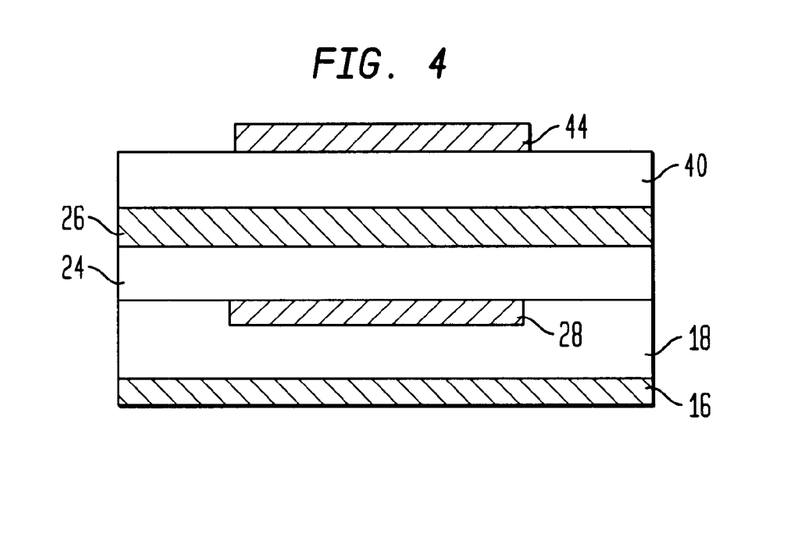
FIG. 4 an assembled cross sectional view of a multi-layer microwave circuit.

As best shown in FIGS. 2A–2C and 3A–3C, a conductive pattern 28 is disposed on the bottom surface 22 of the middle dielectric layer 24. Conductive pattern 28 can be formed by etching the circuit on the bottom surface 22 of middle dielectric layer 24. Alternatively, the conductive pattern 28 could be formed on the top surface 20 of the bottom dielectric layer 18. The first transmission line 12 further includes a bottom ground layer 30 in contact with the bottom surface 16 of the bottom dielectric layer 18. As shown in FIGS. 1 and 3B, first transmission line 12 further includes a top ground layer 32 in contact with the top surface 26 of the middle dielectric layer 24. The first transmission line 12 performs the function of a stripline structure, wherein a conductive strip of material is disposed between two dielectric layers separating the conductive strip of material from two ground planes.

The second transmission line 14 is arranged in a vertically stacked relationship above the first transmission line 12. The second transmission line 14 includes a top dielectric layer 40 having a bottom surface 38 and a top surface 42. A conductive pattern 44 is provided on the top surface 42 of the top dielectric layer 40. As shown in FIG. 3A, the bottom surface 38 of the top dielectric layer 40 optionally includes a ground layer 46 in contact with the bottom surface 38 of the top dielectric layer 40. The structure shown in FIG. 3A performs the function of a microstrip transmission line, wherein a dielectric layer separates a ground plane layer and a conductive pattern arranged on the opposite surface of the dielectric layer. It will also be appreciated that when the first transmission line 12 and the second transmission line 14 are assembled in a vertical stack as shown in the exploded perspective view of FIG. 1, the two transmission lines 12 and 14 will be separated by at least one ground plane. However, it is not necessary to provide the ground layer 32 on the upper surface 26 of the middle dielectric layer 24 and a ground layer 46 on the bottom surface 38 of the top dielectric layer 40. Instead, it will be appreciated that when the circuit is assembled, the ground layer 46 or the ground layer 32 may be sufficient to provide shielding for both transmission lines.

Electrical connection is established between the conductive pattern 28 and the conductive pattern 44 by at least two plated through hole 48. The plated through holes 48 extend through the second transmission line 14. Plated through holes having a diameter of about 0.015 inches may be utilized to form the electrical connection.

It will be appreciated that reference to "bottom," "middle," and "top" are used herein only to indicate general orientation of layers and surfaces relative to each other. Such reference is not be construed as limiting the structure of device or its function in any way.

Advantageously, the present invention provides a multi-layer circuit that can be adjusted by the addition, removal or adjustment of components such as resistors, capacitors, etc. on the top surface of the microstrip circuit. As shown in FIGS. 1 and 2A, a resistor 50, preferably impedance matching resistor, can be added to the circuit of the microstrip transmission line.

A circuit as shown in the figures can be manufactured according to the following method. A first dielectric substrate, preferably a planar generally ceramic-filled soft substrate or ceramic-loaded laminate (collectively, "ceramic-filled substrate"), is provided that has top and bottom surfaces. Particularly preferably dielectric substrates are ceramic-filled with woven glass reinforcement. Such substrates are commercially available under the product name "$CE_r$-10" from Taconic in Petersburgh, N.Y. Other acceptable substrates are provided by Rogers Corporation, such as the Rogers RO 3000 Series. Preferably, the dielectric substrate has a dielectric constant of between about 3 and about 10. Preferably, the substrates include a layer of electrodeposited copper on one or both of the top and bottom surfaces of the substrate. Substrates such as alumina do not necessarily have to include the electrodeposited copper, and conductive material can be added to the surface of the substrate during later manufacturing steps.

Thus according to one aspect of the invention, commercially available planar, ceramic-filled substrates having a conductive layer of material such as copper on both major surfaces of the substrates are provided. The thickness of the conductive layer may from about 0.0007 inches to about 0.0028 inches in thickness. Preferably, first, second and third dielectric substrates are provided according to this aspect of the invention. According to one aspect of the invention, the conductive layer is completely removed from the top surface of the first dielectric substrate, leaving a dielectric substrate having a conductive layer on the bottom surface of the substrate and providing a ground plane. The removal of the conductive material can be achieved by processes known in the art such as etching or milling. It will be appreciated that it may be advantageous to provide a first dielectric substrate having a conductive layer on only one side of the substrate so that the conductive layer on the top surface of the substrate does not have to be removed in an additional manufacturing step.

The method of the invention further involves the step of providing a second dielectric substrate having conductive material on the top and bottom surfaces of the substrate. A portion of the conductive material is removed from the bottom surface of the second dielectric substrate to provide a conductive pattern on the bottom surface of the substrate as shown in FIGS. 2B and 3B. A third dielectric substrate is provided having conductive material on the top and bottom surfaces of the substrate. A portion of the conductive material on the top surface of the third is removed to provide a conductive pattern on the top surface of the substrate.

The first, second and third dielectric substrates are then arranged in a vertically stacked relationship, with the third substrate overlaying the second substrate and the second substrate overlaying the first substrate, similar to the arrangement shown in FIG. 1. This type of stacking arrangement provides a ground plane separating the second and third dielectric layers. As noted above, it will be appreciated that it may not be necessary to provide a conductive layer of material on both the bottom surface of the third (top) dielectric substrate and on the top surface of the second (middle) dielectric substrate to provide the ground plane. A conductive layer on either of these surfaces may be sufficient to provide the ground plane. It also will be appreciated that the stacking arrangement of the first and second dielectric substrates, wherein the second substrate overlies the first substrate, provides a conductive pattern disposed between two dielectric layers having ground planes on the outer surfaces thereof, forming a stripline transmission line. The third substrate, including the conductive pattern on the top surface and the ground plane beneath the dielectric substrate provides a microstrip transmission line.

The conductive pattern on the third (top) dielectric substrate dielectric substrate is connected to the conductive pattern on the second (middle) dielectric substrate by forming at least one plated through hole extending through the third dielectric substrate and the second dielectric substrate and contacting the conductive patterns.

Thus, the present invention seeks to overcome the problems associated with thick film design used in the fabrication of semi-active and passive devices. The present invention overcomes the aforementioned problems through use of a ceramic-filled soft substrate having a patterned copper layer on at least one surface. Such a patterned copper layer can be fabricated with accurate dimensions. The use of a ceramic-filled soft substrate allows for the fabrication of semi-active and passive devices using a standard PCB fabrication process. Semi-active devices manufactured using this process include, but are not limited to, components such as mixers. Passive devices manufactured using this process include, but are not limited to, balanced lines and power splitters. As noted above, the substrates can be supplied with electrode-posited copper and patterns can be etched on the substrate with accurate dimensions. By using a standard PCB fabrication process, no special or relatively expensive facilities are required, as is often the case with thick film substrate manufacturing processes.

The present invention provides a new approach to the design of a microwave structure using a ceramic-filled soft substrate for application with components such as, but not limited to, mixers or splitters. In one embodiment, semi-active and passive devices can be fabricated using a first ceramic-filled soft substrate of dielectric constant of about 10 and a thickness of approximately 0.025 inches. This first substrate acts as a support base, where the copper layer is then patterned using an etching process. A second ceramic-filled soft substrate is next provided having a dielectric constant of about 10 and a thickness between 0.003 inches and 0.005 inches. The substrate is approximately 0.004 inches thick. Two conductive layers are etched on either side of the second substrate using a standard PCB fabrication process. Finally, the second substrate is bonded onto the first substrate, which, as discussed above, acts as a support base. The ceramic-filled material may be $CE_r$-10. Using the proposed method for forming passive and semi-active devices using a standard PCB fabrication process on a soft substrate, it is possible to achieve a line width between 0.003 inches and 0.005 inches within a specified accuracy of 0.0005 inches.

The use of a ceramic-filled soft substrate, such as $CE_r$-10, further allows for a new multi-layer design approach for passive and semi-active devices using a combination of microstrip and stripline techniques. Such a new multi-layer design approach using a combination of microstrip and stripline techniques allows for the development of devices such as, but not limited to, ultra-miniature power splitters having dimensions of 0.3 inches by 0.25 inches. This provides an advantage over standard microstrip design techniques that make such dimensions impossible to achieve, especially in the cellular band of 800–1000 MHz, as the line lengths are too long, approaching 1.3 inches. Further, the meandering of lines will lead to coupling between lines and degrade the overall performance of the device.

The proposed design methodology uses both microstrip and stripline design concepts optimally combined to realize a device in smaller dimensions without degradation in performance. According to one embodiment of the invention, a splitter device is comprised of three layers, where the bottom and middle layers constitute stripline circuitry and the top layer is a microstrip. The microstrip comprises a ceramic-filled soft substrate having a dielectric constant of 10 and a thickness of 0.025 inches. In a preferred embodiment, the ceramic material is comprised of CER-10. Input and output 50 ohm feed lines are etched as microstrip lines on the top layer of the soft substrate. According to one aspect of the invention, a splitter section of quarter wavelength can also etched on the top layer of the microstrip line with minimum meandering. The second section of the splitter is realized as a stripline circuit. The stripline circuit consists of two layers. One layer is provided with a printed pattern and the other is not. The layers are bonded together with the ground plane on either side. The stripline section is then bonded to the top microstrip layer. Transitions from the microstrip layer and the stripline layers are achieved through plated thru holes. Such transitions are preferably 50 ohm transitions. An isolation resistor can be assembled on the top layer.

The disclosed multi-layer design using microstrip and stripline layers leads to ultra-miniature RF/Microwave components, without degradation in performance. Further, a major benefit of this technique is the capability to design miniature surface mount integrated RF/Microwave Subsystems consisting of both active and passive circuits optimally distributed between microstrip and stripline layers.

Figure 5:
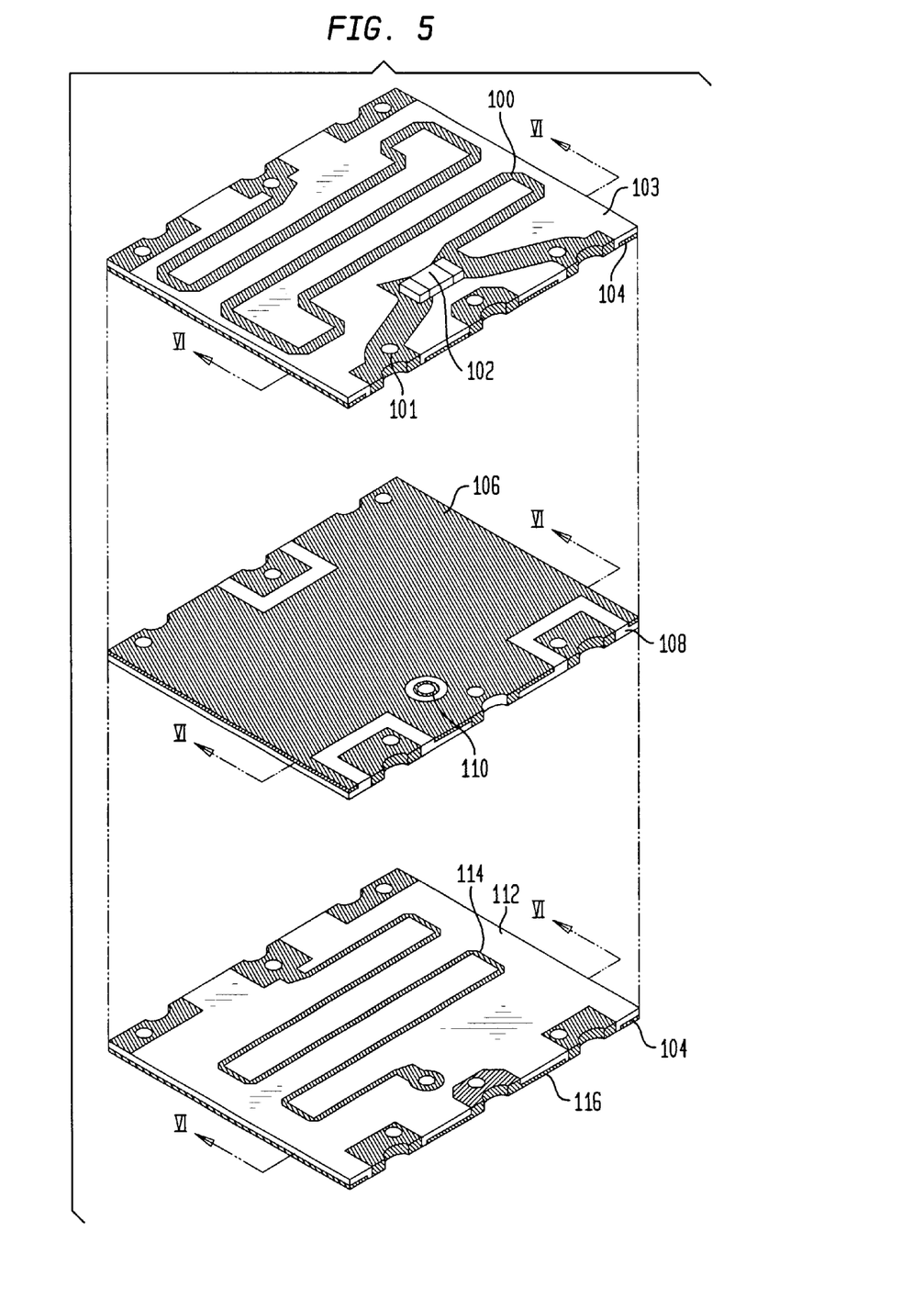
FIG. 5 is an exploded perspective view of a multi-layer two way power divider.

A two-way power divider designed for use in the global system for mobile communications and personal communications services bands in accordance with the present invention is shown in FIG. 5. As shown, a microstrip is formed by etching generally-planar conductors 100 and 101 from the upper surface of generally-planar ceramic-filled top substrate 103. A non-planar, electrical component 102 such as a chip resistor is mounted to the upper surface of the substrate 103 so as to establish an electrical connection between conductors 100 and 101. (Generally, the component will be added after assembly with the other substrates.) Substantially all of the lower surface of the top dielectric 103 is covered by a ground plane 104. The top layer, including the conductors, dielectric and ground plane, functions as a microstrip.

A top layer 103 is superposed over middle dielectric layer 108. (FIG. 5 is shown in exploded view for ease of understanding). A ground plane 106 is disposed on the upper surface of the middle dielectric layer 108. As shown, the ground plane is discontinuous in certain areas such as near through-hole 110.

Figure 6:
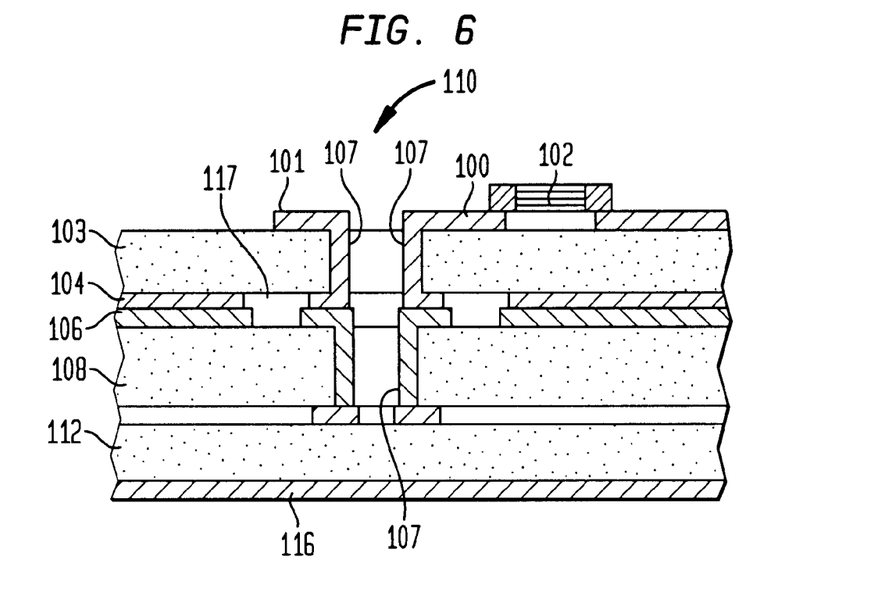
FIG. 6 is a cross-sectional view of a portion of the power divider shown in FIG. 5, taken a long line VI.

Through hole 110 is shown in cross-section in FIG. 6. The hole extends from the upper to the lower surface of dielectric layer 103. The sides 107 of the hole are coated with a conductor such as copper, thus providing an electrical connection from the top to the bottom surface of the layer. As also shown, there is an annular gap 117 etched around the bottom of the through hole 110, thus separating the conductor in the through hole from the ground plane 104. Resistor 102 can also be seen mounted to, and extending above, the upper surface of the first dielectric layer 103.

There are numerous manners in which the ground plane can be formed at the interface of the two layers. Although a ground plane is present on both the lower surface of the top dielectic layer 103 and the upper surface of the middle dielectric layer 108, the ground plane may also be disposed on only one of those two surfaces. The ground plane may also comprise be a thin sheet which is laid upon or between the layers rather than being etched. However, based on current manufacturing procedures, it is particularly advantageous to etch the ground plane from one or both of the layers.

The bottom layer 112 has a conductor 114 etched from the upper surface of the ceramic-filled dielectric. Accordingly, because of that conductor, there is no ground plane disposed along the bottom surface of the second layer 108. Otherwise, the entire length of conductor 114 would be connected to ground. Ground plane 116 occupies the lower surface of bottom layer 112. When assembled, conductor 114 functions as a stripline. Rather than having the conductor 114 etched from the upper surface of the third bottom 112, it may also be disposed at the interface of the middle and bottom layers by etching it from the lower surface of the middle layer 108.

The use of a ceramic-filled substrate is particularly advantageous for use in connection with the invention because, among other things, its properties are conducive to vertically integrating the components. While typical substrates with higher dielectric constants (such as 10.2) may satisfy size constraints, they tend to be soft and flexible. If the material is too soft, the sides of the through hole may be too rough to accept a satisfactory copper coating. Substrates with low dielectric constants (such as 2.2) tend to be harder, but more material must be used in order to make up for the lower dielectric constant. Accordingly, the increased layer thickness causes the physical dimensions of the circuit to increase and, thus, makes the circuit unattractive for use in miniaturized equipment such as cell phones. Alumina ($Al_2O_3$) substrates may satisfy dielectric and size requirements. However, they tend to be expensive and require atypical manufacturing processes in order to etch. Accordingly, while alumnina may be useful in military applications, their expense and need for specialized manufacturing processes often makes them unsuitable for low-cost mass production of consumer products.

Ceramic-filled substrates, on the other hand, have a dielectric constant which is sufficiently high enough to permit microstrips and striplines with thin dielectric layer thicknesses. Moreover, the material is hard enough to support thin and smooth through holes. In addition, they do not require any specialized etching processes and, accordingly, can be mass-produced relatively inexpensively.

Figure 7:
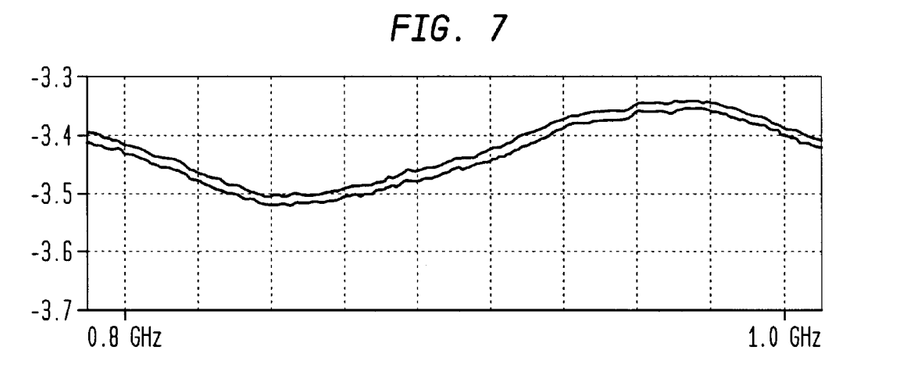
FIG. 7 is a graph of insertion loss versus wavelength for a two way power divider.
Figure 8:
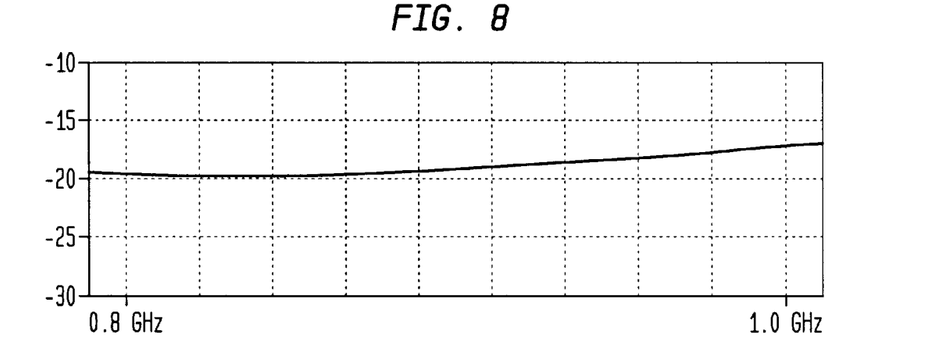
FIG. 8 is a graph of port to port isolation for a two way power divider.

In production, the length, width and height dimensions of the power divider of FIG. 5 can be as small as 0.3 inches× 0.25 inches×0.1 inches. As shown in FIG. 7, the two-way surface mount power divider achieves a typical insertion loss performance of 0.5 dB from 800 to 1000 MHz. As shown in FIG. 8, the typical port-to-port isolation is 19 dB. The typical input voltage standing-wave ratio (VSWR) is 1.50:1 and the typical output VSWR is 1.30:1. The two-way power divider achieves maximum amplitude imbalance between ports of 0.5 dB and phase imbalance of 4 degrees.

Figure 9:
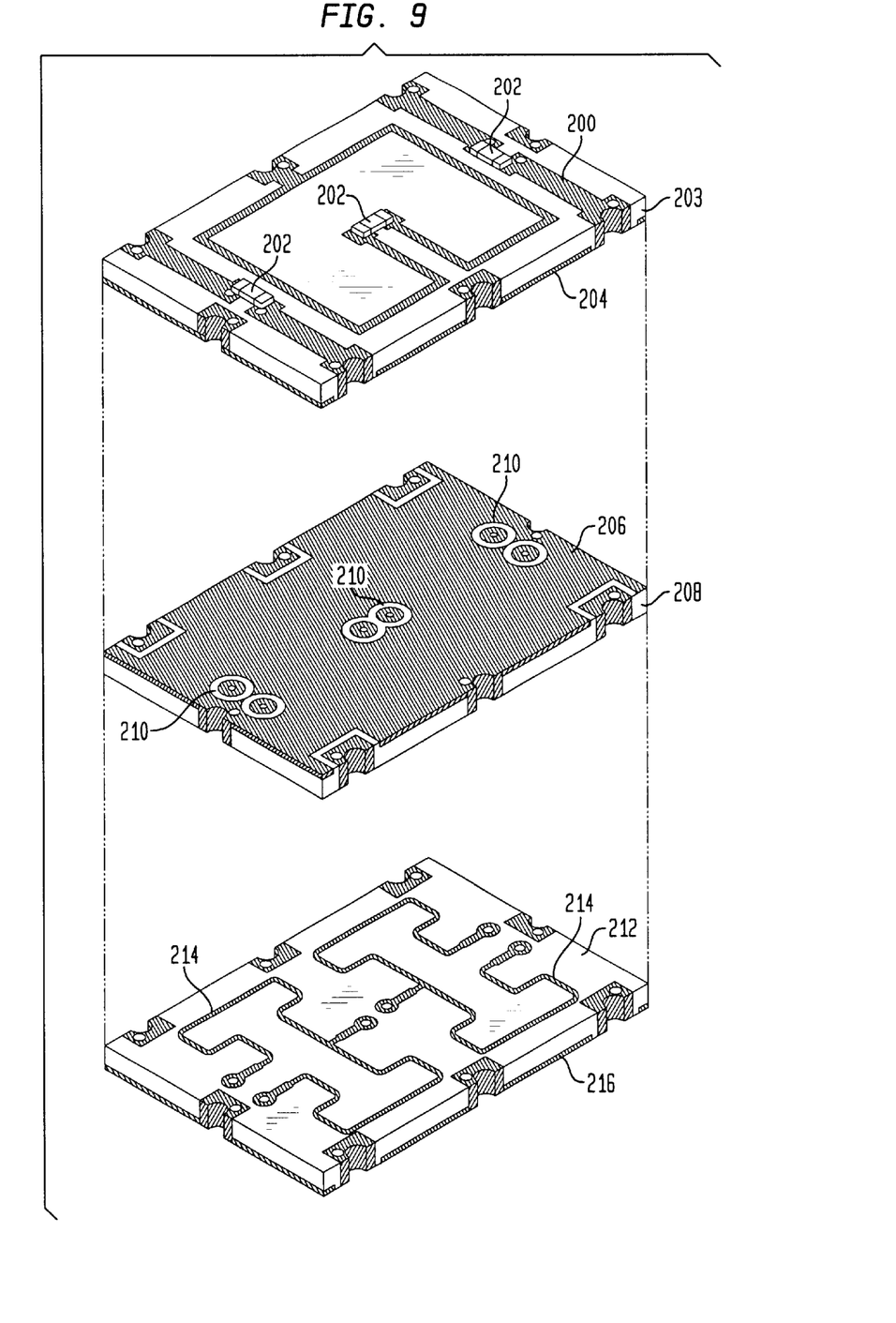
FIG. 9 is an exploded perspective view of a multi-layer four way power divider.

A four-way splitter in accordance with the present invention is shown in exploded view in FIG. 9. As with the two-way splitter of FIG. 8, it has a top 203, middle 208 and bottom layer 212. A conductor 200 is etched from the upper surface of the ceramic-filled top substrate 203 and non-planar components 202 are mounted on top of the layer. A ground plane 204 is disposed along the bottom. Middle layer 208 includes a ceramic-filled substrate 208 and a ground plane 206 along the top. There breaks in the ground plane 206 to accommodate the through holes 210 which electrically connect conductor 200 of the top layer to conductor 214 of the bottom layer. Bottom layer 212 is also comprised of a ceramic-filled substrate upon which conductors 214 are disposed. Bottom layer 212 also has a ground plane 216 disposed along its bottom surface.

Figure 10:
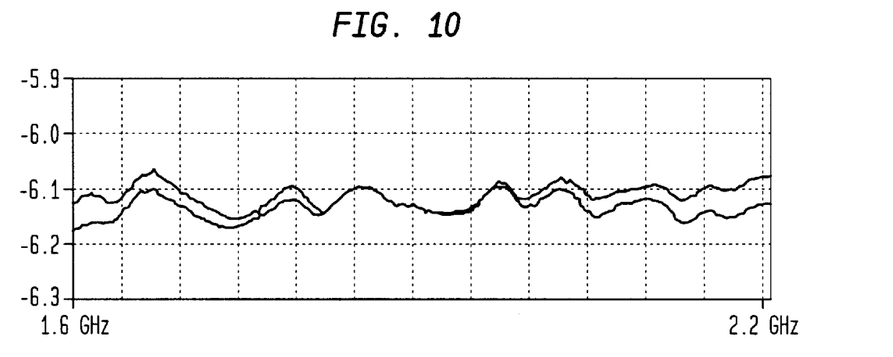
FIG. 10 is a graph of insertion loss for a four way power divider.
Figure 11:
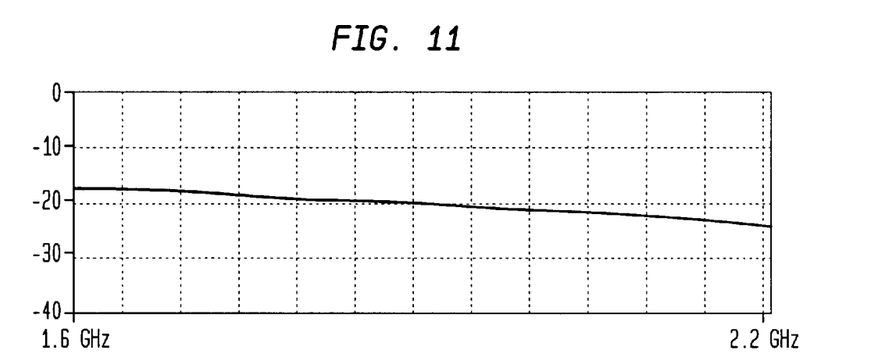
FIG. 11 is a graph of port to port isolation for a four way power divider.

The four-way power splitter of FIG. 9 may be operated from 1600 to 2200 MHz. The dimensions of the four-way splitter may be 0.5 inches long, 0.375 inches wide by 0.15 inches high. Referring to FIG. 10, the four-way splitter achieves a maximum insertion loss of 0.8 dB from 1800 to 2200 MHz frequency range. As shown in FIG. 11, the typical port-to-port isolation is 19 dB. The typical input VSWR is 1.50:1 and the typical output VSWR is 1.30:1. The four-way power divider achieves maximum amplitude imbalance between ports of 0.5 dB and phase imbalance of 8 deg.

Mixers are traditionally difficult to miniaturize due to their matching structures using broadband balanced/ unbalanced (balun) components. A typical layout for a standard high-frequency mixer using distributed baluns for impedance matching the RF and local oscillator (LO) ports (50 Ohms externally) to the low impedance of the mixer diodes is realized using planar-circuit approaches. These baluns are normally formed on 10-mil-thick soft substrate materials with a dielectric constant of 2.2. The approach requires a carrier plate or housing to integrate the balun/ mixer structure into a subsystem. The typical size of such a mixer is 0.5×0.25×0.030 inches (1.27×0.64 cm). Such a design is well known in the high-frequency industry, but is extremely difficult to miniaturize further.

Figure 12:
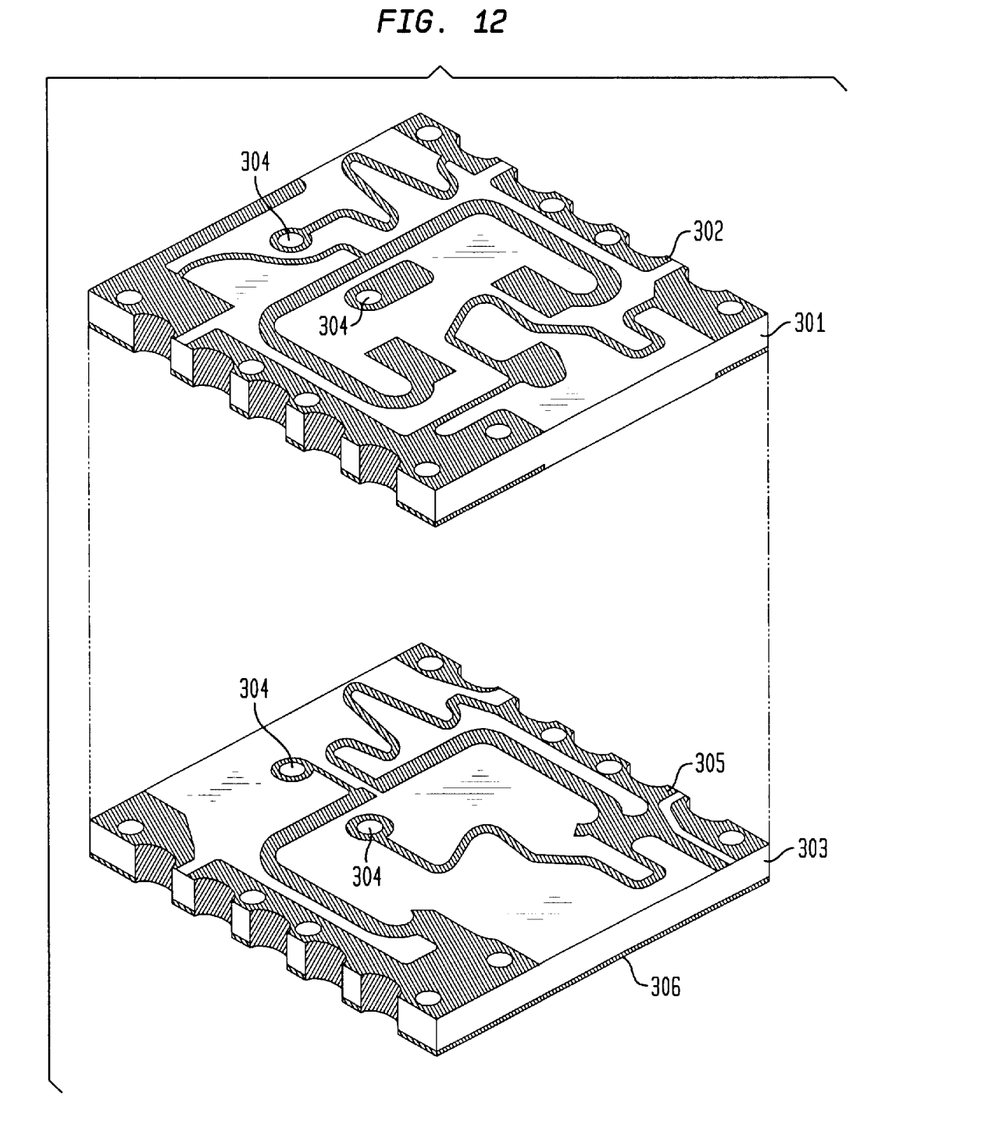
FIG. 12 is an exploded perspective view of a surface mount mixer.
Figure 13:
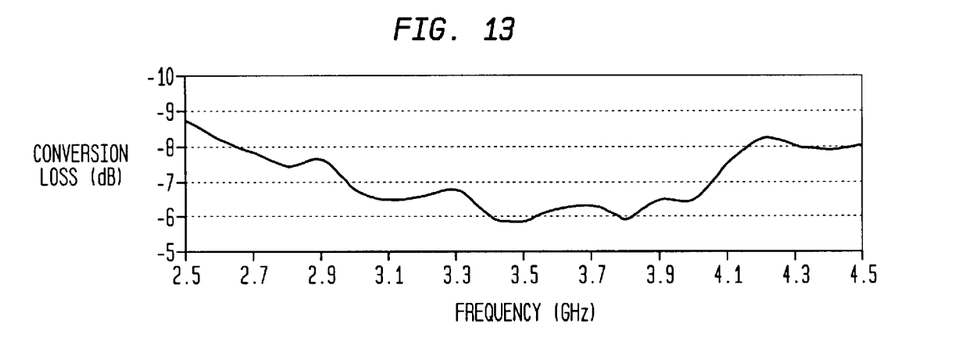
FIG. 13 is a graph of conversion loss for a surface mount mixer.
Figure 14:
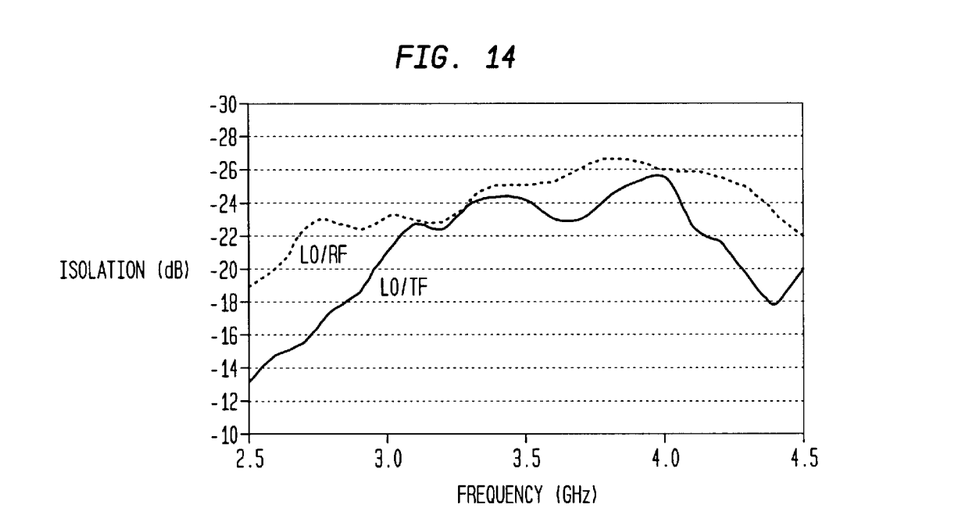
FIG. 14 is a graph of isolation for a surface mount mixer.

FIG. 12, on the other hand, illustrates a , double-balanced microwave mixer that rivals the size and performance of gallium-arsenide (GaAs) mixers. It includes two dielectric layers 301 and 303, both of which have conductors 302, 305, respectively, etched from the upper surface of the layers. Conductors 302 and 305 are in electrical communication via, among other things, through holes 304. A ground plane 306 is disposed along the bottom surface. Such a surface mount mixer may measure only 0.3 inches long×0.275 inches wide×0.030 height (0.75×0.69 cm). Referring to FIGS. 13 and 14, such a surface mount mixer may exhibit an RF and LO range of 3 to 4 GHz (typical) and an intermediate-frequency (IF) range of DC to 600 MHz. The maximum conversion loss is 9 dB, with typical performance of 6.5 dB. The LO-to-RF isolation is better than 20 dB (and typically 25 dB) and LO-to-IF isolation is better than 20 dB (and typically 24 dB). The mixer can be supplied for use with a wide range of LO drives levels, from approximately +7 to +20 dBm.

By using the multi-layer approach of the invention and soft substrate materials, the mixer consists of a broad-side-coupled balun for RF and LO impedance matching that is printed on both sides of a 5-mil-thick, ceramic-filled soft substrate with dielectric constant of 10. The balun structure is bonded to a 25-mil-thick substrate, also with dielectric constant of 10, which acts as a base. The only component that must be mounted in this assembly is a quad diode, which is placed on the top layer.

It will be apparent to those skilled in the art that various modifications and variations can be made to the present invention without departing from the spirit or scope of the invention. Thus, it is intended that the present invention cover modifications and variations of this invention provided they come within the scope of the appended claims and their equivalents.

What is claimed is:

1. A multi-layer circuit comprising:

a first transmission line having a bottom dielectric layer and a middle dielectric layer arranged in a vertically stacked structure, the bottom and middle dielectric layers each having top and bottom surfaces, a conductive pattern disposed between the bottom surface of the middle dielectric layer and the top surface of the bottom dielectric layer, and a bottom ground layer in contact with the bottom surface of the bottom dielectric layer; and a second transmission line arranged in a vertically stacked relationship above said first transmission line, the second transmission line having a top dielectric layer having top and bottom surfaces, a conductive pattern in contact with the top surface of the top dielectric layer and at least one ground layer separating the bottom surface of the top dielectric layer and the top surface of the middle dielectric layer, wherein electrical connection is established between the first and second transmission lines by at least one plated through hole extending through the second transmission line, and each of the dielectric layers comprises a ceramic-filled substrate with woven glass reinforcement.

2. The circuit of claim 1 wherein the circuit operates at microwave frequencies.

3. The circuit of claim 1, wherein the dielectric layer has a dielectric constant from about 3 to about 10.

4. The circuit of claim 3, wherein the thickness of the dielectric layer is between about 0.004 inches and about 0.031 inches.

5. The circuit of claim 1, wherein the ground layers include copper.

6. A power splitter including the circuit of claim 1.

7. The power splitter of claim 6, wherein the power splitter is a two-way power splitter generally planar in shape and having a length and a width less than about 0.4 inches.

8. A method of fabricating a multi-layer circuit comprising:
providing top, middle and bottom dielectric substrates, each such substrate having an upper surface and a lower surface, and each of the dielectric substrates comprises a ceramic-filled dielectric substrate;
stacking said substrates in top-to-bottom superposed order so as to form a first interface between the top and middle substrates and a second interface between the middle and bottom substrates;
providing an upper conductor on the upper surface of the top layer;
providing a middle conductor extending through the middle substrate from the upper surface to the bottom surface of the middle substrate, the middle conductor being in contact with the upper conductor;
prior to the stacking step, providing a ground plane on the lower surface of the top substrate, on the upper surface of the middle substrate or both, such that the ground plane is disposed at the first interface but not in contact with the middle conductor; and
prior to the stacking step, providing a lower conductor on the lower surface of the middle substrate, on the upper surface of the bottom substrate or both, such that the lower conductor is in contact with the middle conductor.

9. A multi-layer circuit comprising a microwave component fabricated in accordance with the method of claim 8.

10. The method of claim 8 further including providing a ground plane on the lower surface of the bottom substrate.

11. A multi-layer circuit comprising a power splitter fabricated in accordance with the method of claim 8.

12. The method of claim 8, wherein each dielectric substrate is an ceramic-filled substrate with woven glass reinforcement.

13. The method of claim 8, wherein the dielectric substrates have a dielectric constant between about 3 and about 10.

14. The method claim 8, wherein the step of forming the conductive pattern includes etching or milling the pattern.

15. The method of claim 14, wherein the conductive material includes copper.

16. A circuit comprising:
a generally-planar first conductor disposed upon a top dielectric layer,
a generally-planar first ground disposed below the top dielectric layer,
a middle dielectric layer disposed below the first ground plane,
a generally-planar second conductor disposed below the middle dielectric layer,
a bottom dielectric layer disposed below the second conductor,
a generally-planar second ground disposed below the bottom dielectric layer,
such that the first conductor, top dielectric layer and first ground form a microstrip, and the first and second grounds, the middle and bottom layers and the second conductor form a stripline, wherein the dielectric layers each include ceramic-filled substrates.

17. The circuit of claim 16 wherein the conductors include copper.

18. The circuit of claim 16 wherein the first conductor is etched or milled from a coating on the top dielectric layer.

19. The circuit of claim 18 wherein the second conductor is etched or milled from a coating on either the middle dielectric layer or bottom dielectric layer.

20. The circuit of claim 16, further including a third conductor extending through the middle layer from the first conductor to the second conductor.

21. The circuit of claim 20 wherein the third conductor does not contact the first ground.

22. The circuit of claim 16 further including a non-planar component mounted to the first conductor.

23. The circuit of claim 22 wherein the non-planar component includes a resistor.

* * * * *

UNITED STATES PATENT AND TRADEMARK OFFICE
CERTIFICATE OF CORRECTION

PATENT NO.    : 6,525,623 B2
DATED         : February 25, 2003
INVENTOR(S)   : Mahadevan Sridharan and Vasanth Munikoti It is certified that error appears in the above-identified patent and that said Letters Patent is hereby corrected as shown below:

Column 2,
Line 51, before "middle" insert -- the --
Line 62, "overlaying" should read -- overlie --.
Line 63, "overlaying" should read -- overlies --.

Column 3,
Line 14, after "of" insert -- the --.

Column 4,
Line 4, delete "a" (second occurrence).
Line 23, "a long" should read -- along --.

Column 5,
Line 39, "hole" should read -- holes --.

Column 6,
Line 11, after "may" insert -- be --.
Line 35, after "third" insert -- dielectric substrate --.
Line 60, delete "dielectric substrate --.

Column 8,
Line 55, delete "be" after "comprise".

Column 9,
Line 51, after "There" insert -- are --.

Column 10,
Line 15, after "a" delete ",".
Line 32, "drives" should read -- drive --.

UNITED STATES PATENT AND TRADEMARK OFFICE
CERTIFICATE OF CORRECTION

PATENT NO. : 6,525,623 B2
DATED : February 25, 2003
INVENTOR(S) : Mahadevan Sridharan and Vasanth Munikoti It is certified that error appears in the above-identified patent and that said Letters Patent is hereby corrected as shown below:

Column 12,
Line 4, "an" should read -- a --.
Line 9, after "method" insert -- of --.

Signed and Sealed this

Second Day of September, 2003

JAMES E. ROGAN
*Director of the United States Patent and Trademark Office*